(12) United States Patent
Merugu et al.

(10) Patent No.: US 8,983,790 B1
(45) Date of Patent: Mar. 17, 2015

(54) METHOD AND SYSTEM FOR GATHERING SIGNAL STATES FOR DEBUGGING A CIRCUIT

(75) Inventors: Ushasri Merugu, Puppal Guda (IN); Siva V. N. Hemasunder Tallury, Hyderabad (IN); Sudheer Kumar Koppolu, Proddatur (IN)

(73) Assignee: Xilinx, Inc., San Jose, CA (US)

( * ) Notice: Subject to any disclaimer, the term of this patent is extended or adjusted under 35 U.S.C. 154(b) by 685 days.

(21) Appl. No.: 13/111,697

(22) Filed: May 19, 2011

(51) Int. Cl.
| | |
|---|---|
| *G01R 31/28* | (2006.01) |
| *G01R 31/3177* | (2006.01) |
| *G01R 31/317* | (2006.01) |
| *G01R 13/34* | (2006.01) |
| *G01R 13/32* | (2006.01) |
| *G06F 11/25* | (2006.01) |
| *G06F 11/34* | (2006.01) |

(52) U.S. Cl.
CPC ............ *G01R 31/3177* (2013.01); *G01R 31/28* (2013.01); *G01R 31/31701* (2013.01); *G01R 13/345* (2013.01); *G01R 13/32* (2013.01); *G06F 11/25* (2013.01); *G06F 11/348* (2013.01)
USPC ............... 702/120; 702/57; 702/117; 714/37; 714/39; 714/45; 714/724; 714/725; 714/732; 714/742

(58) Field of Classification Search
CPC ............... G01R 31/28; G01R 31/3177; G01R 31/31701; G01R 13/32; G01R 13/345; G06F 11/25; G06F 11/348
USPC .......... 702/57, 117, 120; 714/37, 39, 45, 725, 714/724, 732, 742; 326/37, 38
See application file for complete search history.

(56) References Cited

U.S. PATENT DOCUMENTS

| | | | | | |
|---|---|---|---|---|---|
| 5,557,573 | A | * | 9/1996 | McClure ........................ | 365/201 |
| 5,933,594 | A | * | 8/1999 | La Joie et al. ................... | 714/26 |
| 6,396,517 | B1 | * | 5/2002 | Beck et al. ..................... | 715/771 |
| 6,463,481 | B1 | * | 10/2002 | Lupien et al. ................... | 710/22 |
| 6,523,102 | B1 | * | 2/2003 | Dye et al. ....................... | 711/170 |
| 6,615,377 | B1 | * | 9/2003 | da Cruz et al. ................. | 714/724 |
| 7,039,834 | B1 | * | 5/2006 | Orfali .............................. | 714/39 |
| 7,536,615 | B1 | * | 5/2009 | Pierce et al. .................. | 714/725 |
| 7,650,248 | B1 | | 1/2010 | Baxter | |
| 7,840,781 | B1 | * | 11/2010 | Velusamy et al. .............. | 712/34 |
| 2004/0190037 | A1 | * | 9/2004 | Shindoh ........................ | 358/1.13 |

OTHER PUBLICATIONS

Altera, Inc., "Design Debugging Using the SignalTap II Logic Analyzer", *Quartus II Handbook*, Jul. 2010, pp. 17-1 to 17-72, Ver. 10.0, vol. 3, Chapter 17, Altera, Inc., San Jose, California, USA.

(Continued)

*Primary Examiner* — Carol S Tsai
(74) *Attorney, Agent, or Firm* — LeRoy D. Maunu (57) ABSTRACT

Systems and methods gather data for debugging a circuit-under-test. The system includes a trigger-and-capture circuit, a data compressor, a direct memory access controller, and a memory controller. The trigger-and-capture circuit is coupled to the circuit-under-test for receiving signals from the circuit-under-test. The trigger-and-capture circuit is configured to assert a trigger signal when the signals match a trigger condition. The data compressor is configured to loss-lessly compress the signals into compressed data. The direct memory access controller is configured to generate write and read requests. The write requests write the compressed data to a memory integrated circuit die, and the read requests read the compressed data from the memory integrated circuit die. The memory controller is configured to perform the write and read requests.

19 Claims, 4 Drawing Sheets

(56) References Cited

OTHER PUBLICATIONS

Xilinx, Inc., *ChipScope Pro Software and Cores User Manual*, UG029 (v5.1), Oct. 29, 2002, pp. 1-101, Xilinx, Inc., San Jose, California, USA.

Xilinx, Inc., *ChipScope Pro 12.3 Software and Cores User Guide*, UG029 (v12.3), Sep. 21, 2010, pp. 1-254, Xilinx, Inc., San Jose, California, USA.

\* cited by examiner

METHOD AND SYSTEM FOR GATHERING SIGNAL STATES FOR DEBUGGING A CIRCUIT

FIELD OF THE INVENTION

One or more embodiments generally relate to gathering data for debugging a circuit.

BACKGROUND

In-circuit emulators and logic analyzers are often used with programmable logic devices in testing and debugging circuits. Testing and debugging generally entails running the circuit, applying input stimuli, and checking the states of selected signals in the circuit.

In one approach, a programmable integrated circuit includes programmable logic and interconnect resources that are configured to implement the circuit-under-test and a trigger-and-capture circuit. The trigger-and-capture circuit receives signals from the circuit-under-test. The signals include trigger signals and data signals. The trigger signals are used to control the initiation of gathering states of the data signals. The states of the data signals are continuously logged into the on-chip memory of the programmable integrated circuit. The sampled data is then sent to a host computer system via a boundary scan interface that is connected to the on-chip memory. Software executing on the host computer system displays the sampled data and provides a mechanism to adjust the trigger condition via the boundary scan interface.

One or more embodiments enhance testability of circuits.

SUMMARY

In one embodiment, a system gathers data for debugging a circuit-under-test. The system includes a trigger-and-capture circuit, a data compressor, a direct memory access (DMA) controller, and a memory controller. The trigger-and-capture circuit is coupled to the circuit-under-test for receiving signals from the circuit-under-test. The trigger-and-capture circuit is configured to assert a trigger signal when the signals match a trigger condition. The data compressor is configured to loss-lessly compress the signals into compressed data. The DMA controller is configured to generate write and read requests. The write requests write the compressed data to a memory integrated circuit (IC) die, and the read requests read the compressed data from the memory IC die. The memory controller is configured to perform the write and read requests.

In one embodiment, a system gathers data for debugging a circuit-under-test. The system includes a trigger-and-capture circuit, a data selector, a data compressor, a direct memory access (DMA) controller, and a memory controller. The trigger-and-capture circuit is coupled to the circuit-under-test for receiving signals from the circuit-under-test. The trigger-and-capture circuit is configured to assert a trigger signal when the signals match a trigger condition. The trigger-and-capture circuit is also configured to increment an occurrence count at each assertion of the trigger signal. The data selector is configured to output selected data that include the states of a respective subset of the signals for each occurrence value of the occurrence count. The data compressor is configured to loss-lessly compress the selected data for each occurrence value into compressed data for the occurrence value. The DMA controller is configured to generate write and read requests. The write requests write the compressed data for each occurrence value to a memory, and the read requests read the compressed data for each occurrence value from the memory. The memory controller is configured to perform the write and read requests with the memory.

In one embodiment, a method gathers data for debugging a circuit-under-test. A trigger signal is asserted when signals of the circuit under test satisfy a trigger condition. A respective subset of the signals is selected for each assertion of the trigger signal. The states of the respective subset for each assertion of the trigger signal are loss-lessly compressed into compressed data for the assertion of the trigger signal. Write requests are generated and performed to store the compressed data for each assertion of the trigger signal in a memory integrated circuit (IC) die. Read requests are generated and performed to read the compressed data for each assertion of the trigger signal from the memory IC die. The states of the respective subset for each assertion of the trigger signal are decompressed and displayed.

It will be appreciated that one or more other embodiments are set forth in the Detailed Description and Claims, which follow.

DETAILED DESCRIPTION

Figure 1:
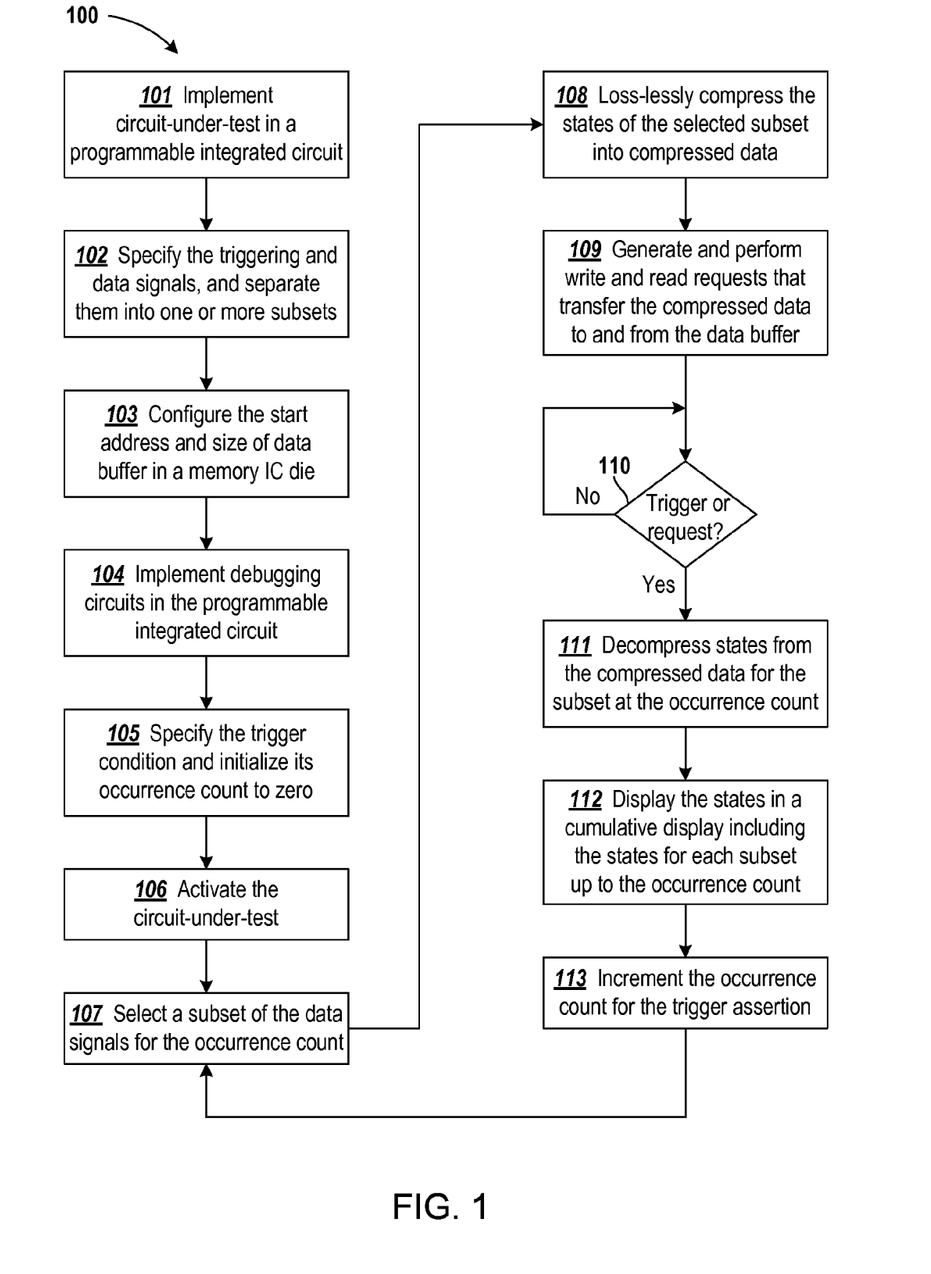
FIG. 1 is a flow diagram of a process for gathering data for debugging a circuit under test.

FIG. 1 is a flow diagram of a process 100 for gathering data for debugging a circuit-under-test. The states of selected signals of the circuit-under-test are stored in a memory integrated circuit (IC) die for later display to a user who is debugging the circuit-under-test.

In one embodiment, the circuit-under-test is implemented in the programmable logic and interconnect resources of a programmable IC die at block 101.

At block 102, certain signals of the circuit-under-test are selected. In one embodiment, these selected signals include triggering signals and data signals. The process 100 of gathering data advances when the triggering signals match a user-specified condition, and the gathered data includes the states of the data signals. It will be appreciated that certain triggering signals could also be data signals, such that the gathered data includes the states of some or all of the triggering signals. In addition, all of the data signals could be triggering signals to permit flexible specification of the trigger condition. The specified data signals of the circuit-under-test are grouped into one or more subsets. The subsets are monitored successively to reduce the data bandwidth required for storing the data signals, while still permitting the monitoring of a large number of data signals. The trigger condition is recreated repeatedly, and the states of one of the subsets of the data signals are captured for each occurrence of the trigger condition.

At block 103, a data buffer is defined in a memory IC die. This data buffer is used to store the captured states of the subsets of data signals. Specified are a starting address and a size of the data buffer. It will be appreciated that the specified starting address and size of the data buffer may be default values that can be subsequently modified. For example, when the memory IC die contains sufficient unallocated storage space, the size of the data buffer may be increased to capture a longer trace of the states of the data signals.

In one embodiment, the states of the data signals are stored in the data buffer until the data buffer becomes full, and then subsequent states are discarded to prevent overflow of the data buffer.

In another embodiment, the data buffer is a circular buffer with newly captured states overwriting previously captured states when the data buffer becomes full. The writing of newly captured states ceases after the trigger condition is satisfied and the buffer becomes full. It will be appreciated that the writing of newly captured states might continue for a delay period after satisfaction of the trigger condition to position the trigger condition near the beginning of the captured data. This is useful for debugging an error occurring after the trigger condition.

In yet another embodiment, while the states of the data signals are being written to the data buffer, the states are also being read from the data buffer. Thus, the data buffer can fill up only if the reading of the states falls behind the writing of the states by the size of the data buffer. While the data buffer is full, the writing of newly captured states is suspended until storage space again becomes available in the data buffer.

At block 104, the debugging circuits other than the data buffer are implemented. In one embodiment, the debugging circuits include a trigger-and-capture circuit, a data selector, a data compressor, a direct memory access (DMA) controller, and a memory controller. These debugging circuits are implemented in the plurality of programmable logic and interconnect resources of a programmable IC die. Implementing the trigger-and-capture circuit may include configuring the programmable logic and interconnect resources to transfer the data signals from the circuit-under-test to the data selector, and implementing the data selector may include configuring the programmable logic and interconnect resources to select a subset of the data signals for each occurrence of the trigger condition.

At block 105, the trigger condition is specified and an occurrence count for the trigger condition is initialized to zero. In one embodiment, while the triggering and data signals are selected before implementing the debugging circuits at block 104, the trigger condition can be specified dynamically by storing the trigger condition in certain registers of the trigger-and-capture circuit. Similarly, the defaults specified at block 103 for the start address and the size of the data buffer are dynamically modifiable in this embodiment.

At block 106 the circuit-under-test is activated. This includes repeatedly creating the scenario that causes the trigger condition to be satisfied by the triggering signals.

At block 107, a subset of the data signals is selected. The selected subset is the subset corresponding to the current value of the occurrence count. For the first execution of block 107, the occurrence count has the initial value of zero set at block 105, and the corresponding subset for this occurrence count of zero is the first subset of the data signals.

At block 108, the states of the subset for current value of the occurrence count are loss-lessly compressed into corresponding compressed data. In one embodiment, each data signal in the subset is loss-lessly compressed with a run-length encoding that specifies a sequence of pairs of a state of the data signal and the number of clock cycles during which the data signal has that state. This usually compresses the needed space for storing the data signals, especially when the data signals often have the same value for multiple cycles.

At block 109, write requests are generated and performed to store the compressed data for each occurrence of the trigger condition, and the write requests store this compressed data in the data buffer within the memory IC die. In one embodiment, the data buffer within the memory IC die is essentially a large first-in-first-out (FIFO) buffer, and read requests are generated and performed concurrently to read the compressed data for each occurrence of the trigger condition from the data buffer within the memory IC die. In another embodiment, the read requests are generated and performed after the trigger condition or information request is detected at decision block 110.

Decision block 110 checks for the trigger condition or an information request. Each time the triggering signals of the circuit-under-test satisfy the trigger condition, a trigger signal is asserted and process 100 proceeds to block 111. The asserted trigger signal indicates availability of states sampled near the trigger condition for the corresponding subset of the data signals. Sometimes, the trigger condition does not occur or the trigger condition does not occur enough times to capture every subset of the data signals. In such a scenario, a user can submit an information request to display the captured states for the current subset. While these states may have limited usefulness for debugging an error expected to occur near the trigger condition, these states may be useful for debugging the lack of the trigger condition. For example, these states may show that the trigger condition is missing because the circuit-under-test is deadlocked. In summary, decision block 110 checks for the trigger condition or for an information request, which is often generated due to the lack of the trigger condition.

In one embodiment, a remote user generates the information request. The captured states may be stored in the memory IC die for a long time period before the remote user initiates the information request to upload and display the captured states. In one example, the remote user is not connected to the programmable IC die or the memory IC die when the captured states are written to the data buffer in the memory IC die at block 109. When the trigger condition is an uncorrectable fault or a protocol violation, the captured states could help the remote user debug the detected error. The memory IC die is physically removed from the system of the circuit-under-test, and the memory IC die is transported and connected to the computer system of the remote user or to another computer system connected to the remote user's computer system via the internet. To prevent loss of stored state, the memory IC die is a non-volatile memory IC die, such as a flash memory die. The remote user generates the information request to read, decompress, and display the captured states for debugging the detected error.

At block 111, the states are decompressed for the subset of data signals corresponding to the current assertion of the trigger signal. The current value of the occurrence count indicates the subset corresponding to each assertion of the trigger signal, and the states for this subset are decompressed from the compressed data for the occurrence value at the assertion of the trigger signal. In one embodiment, the compressed data uses a run-length encoding and the decompression repeats each stored state of each data signal for the number of times specified in the run-length encoding.

At block 112, the decompressed states are displayed for the subset corresponding to the current assertion of the trigger signal. In one embodiment, these decompressed states are added to a cumulative display that includes the states for the subsets corresponding to the values from zero to up to the current value of the occurrence count. Thus, each time the trigger condition is asserted, another subset of the data signals is added to the cumulative display until the trigger condition is repeated enough times to display all of the data signals in the cumulative display.

In one embodiment, the data written to the data buffer includes an indication or marker for the position of the trigger condition in each collected subset of the data signals. Thus, the cumulative display can align the displayed states in each subset, and the cumulative display can highlight the clock cycle in which the trigger condition was satisfied across all of the displayed data signals. When a subset of data signals is displayed in response to an information request, the subset does not have a trigger marker. Thus, the cumulative display does not align the subset of data signals when an information request, and not a trigger assertion, causes the display of a subset in the cumulative display.

At block 113, the occurrence count for the trigger condition is incremented for each assertion of the trigger signal. Process 100 then returns to block 107 and the next subset of data signals is selected based on the incremented occurrence count. This enables gathering the states of this next subset of data signals upon recreating the trigger condition.

Figure 2:
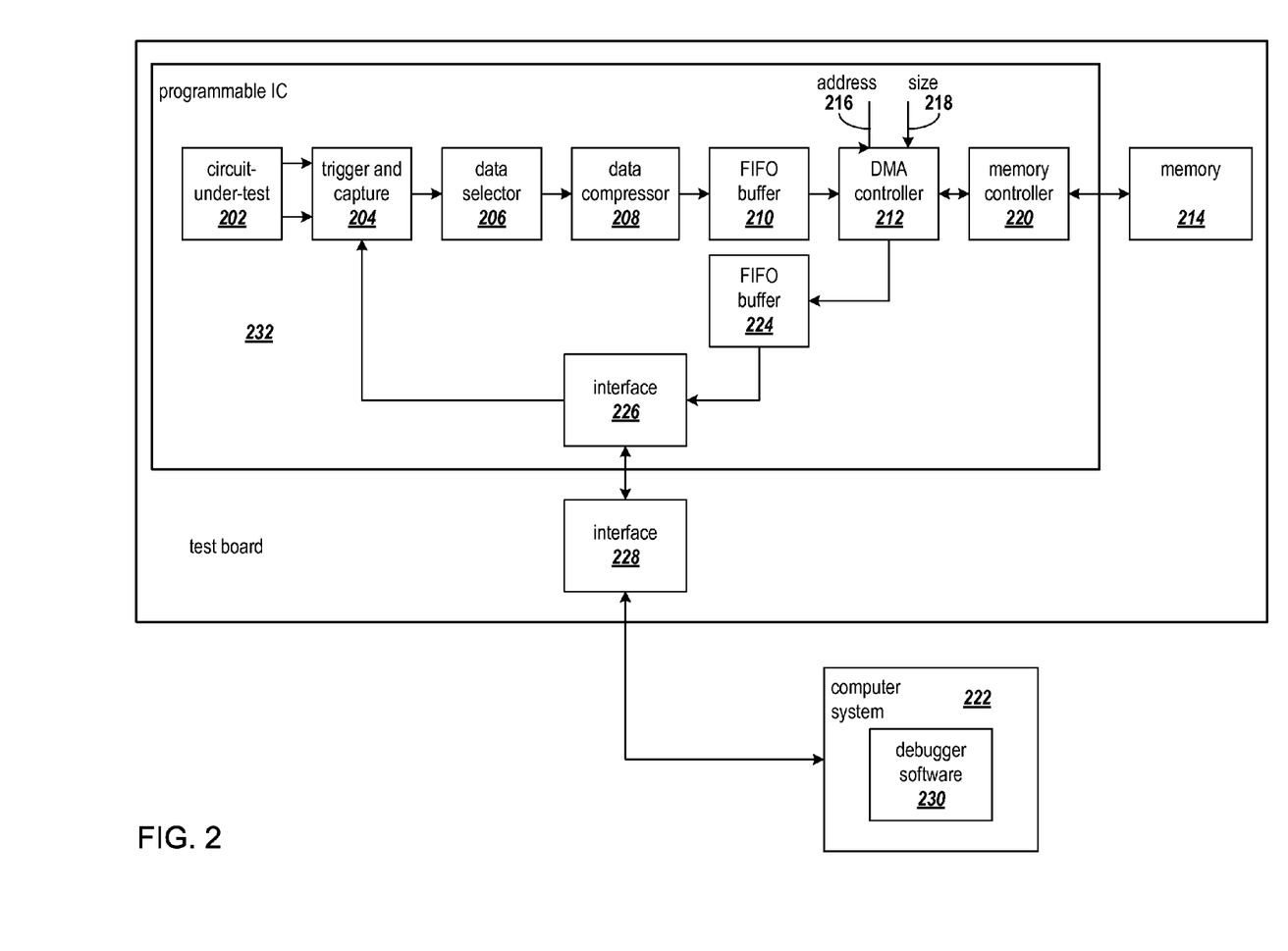
FIG. 2 is a block diagram of a system for gathering data for debugging a circuit under test.

FIG. 2 is a block diagram of a system for gathering data for debugging a circuit-under-test 202. The states of selected signals of the circuit-under-test are stored in a memory IC die 214 for subsequent display to a user who is debugging the circuit-under-test 202.

A trigger-and-capture circuit 204 receives signals from the circuit-under-test 202. The trigger-and-capture 204 circuit is configured to assert a trigger signal and to increment an occurrence count when the signals match a trigger condition.

A data selector 206 is configured to output selected data that include the states of a respective subset of the signals for each value of the occurrence count. As the trigger condition is recreated and the occurrence count increments through a range of values, the data selector 206 outputs the states of successive subsets of the signals. Thus, the states of all of the signals are output after recreating the trigger condition multiple times.

A data compressor 208 is configured to loss-lessly compress the selected data for each occurrence value into compressed data for the occurrence value. In one embodiment, the data compressor 208 compresses the selected data using a run-length encoding.

A write first-in-first-out (FIFO) buffer 210 couples the data compressor 208 and the direct memory access (DMA) controller 212. The write FIFO buffer 210 transfers the compressed data for each occurrence value from the data compressor 208 to the DMA controller 212. The write FIFO buffer 210 accumulates compressed data until there is enough data to fill a write transaction, and the write FIFO buffer 210 has enough data storage to accommodate the worst case of ineffective compression of the selected data and the highest possible latency for the DMA controller 212 to accept data for the next write transaction.

In one embodiment, sufficient bandwidth is provided to indefinitely sustain transferring the selected data from the data selector 206 to the memory IC die 214. The required bandwidth need not support all of the monitored signals; instead, the required bandwidth needs to successively support each subset of the monitored signals. Thus, the required bandwidth is reduced by approximately the number of subsets.

The DMA controller 212 is configured to generate write requests for writing the compressed data for each occurrence value into a data buffer within the memory IC die 214. The DMA controller 212 receives an address on line 216 and a size on line 218. The address on line 216 specifies the start of the data buffer within the memory IC die 214 and the size on line 218 specifies the size of the data buffer. Each write request generated by the DMA controller 212 specifies a successive memory address within the data buffer together with some compressed data from the write FIFO buffer 210.

The memory controller 220 is configured to perform the write requests to the memory IC die 214. Thus, the DMA controller 212 segments the compressed data for each occurrence value into a series of write transactions, and the memory controller 220 performs the write transactions.

When the trigger signal is asserted or a user submits an information request at computer system 222, the compressed data from the data buffer in memory IC die 214 is transferred to computer system 222 for display to the user. The DMA controller 212 generates read requests for reading the compressed data for the current occurrence count, and the memory controller 220 performs these read requests to the data buffer in the memory IC die 214. The DMA controller 212 delivers the compressed data read by these read requests to the read FIFO buffer 224.

The read FIFO buffer 224 transfers the compressed data for each occurrence value from the DMA controller 212 to the computer system 222 via interfaces 226 and 228. The read FIFO buffer 224 has enough data storage to accommodate the latency for the DMA controller 212 to provide the compressed data in each read request and the latency for the computer system 222 to accept the compressed data from the read request.

In one embodiment, the write transactions continuously write the compressed data for the current occurrence value into the data buffer, and the read transactions continuously read the compressed data for the current occurrence value from the data buffer. Thus, the computer system 222 continuously receives the compressed data for each occurrence value of the occurrence count. Upon each assertion of the trigger signal, the debugger software 230 of computer system 222 can decompress and display the compressed data already received, and the computer system 222 can continue to receive the rest of the compressed data for the current occurrence value. At the same time, the controllers 212 and 220 can begin writing the compressed data for an incremented value of the occurrence count. Thus, very long traces of all the monitored signals can be displayed at computer system 222, with the length of the trace limited primarily by the available storage in computer system 222.

In one embodiment, the system includes two IC dies 214 and 232. IC die 214 is a memory IC die, such as a double data rate (DDR) synchronous dynamic random access memory (SDRAM) die, a static random access memory (SRAM) die, or a flash non-volatile memory die, and IC die 232 is a programmable IC die, such as a field-programmable gate array (FPGA) die. The programmable IC die 232 includes programmable logic and interconnect resources. The programmable logic and interconnect resources are configured to implement the circuit-under-test 202, the trigger-and-capture circuit 204, the data selector 206, the data compressor 208, the write FIFO buffer 210, the DMA controller 212, the memory controller 220, the read FIFO buffer 224, and possibly interface 226. The interface 226 may incorporate one or more programmable high-speed serial transceivers to implement an Ethernet interface, an interface for Universal Serial Bus (USB), or an interface for Peripheral Component Interconnect (PCI) Express. The interface 226 may also be a serial boundary-scan interface.

A user of a general-purpose computer system 222 begins debugging by specifying the trigger condition. In response to the user specifying the trigger condition, the debugger software 230 of the computer system 222 writes the trigger condition into the trigger-and-capture circuit 204 via the interfaces 228 and 226. Subsequently, the computer system 230 receives the compressed data for each occurrence value from the memory IC die 214 via the memory controller 220, the DMA controller 212, the read FIFO buffer 224, and the interfaces 226 and 228. The debugger software 230 of the computer system 222 decompresses and displays the states of the signals from the compressed data for each occurrence value. In one embodiment, debugger software 230 of the computer system 222 displays the states of each subset of the monitored signals in a cumulative display that includes the states of the subsets for the occurrence value from zero up to the current occurrence count.

In one embodiment, the computer system 222 is a remote computer system operated by a remote user. To debug the circuit-under-test 202, the remote user can submit an information request to retrieve compressed states already stored in memory IC die 214. The debugger software 230 of the computer system 222 then decompresses and displays the states of the signals for the occurrence value currently provided by the occurrence count.

Figure 3:
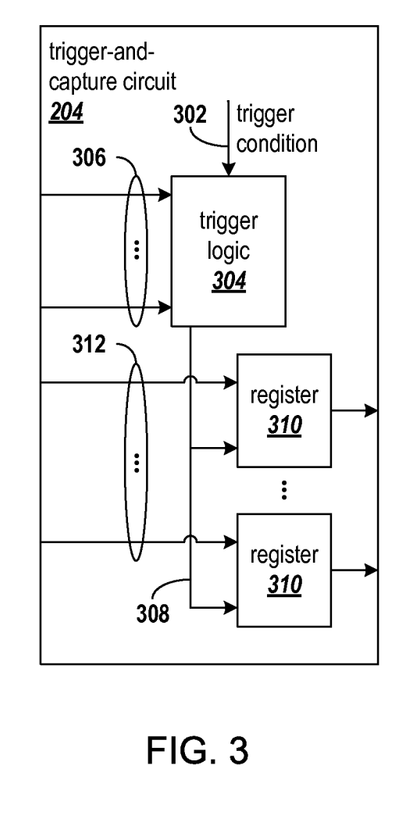
FIG. 3 is a block diagram of the trigger-and-capture circuit of FIG. 2.

FIG. 3 is a block diagram of the trigger-and-capture circuit 204 of FIG. 2. The trigger logic 304 receives a trigger condition on line 302. Trigger logic 304 checks for a match between the triggering signals on lines 306 and the trigger condition on line 302. When the triggering signals on lines 306 satisfy the trigger condition on line 302, the trigger logic 304 generates the trigger signal on line 308, which is provided to registers 310 for capturing the state of signals 312.

Figure 4:
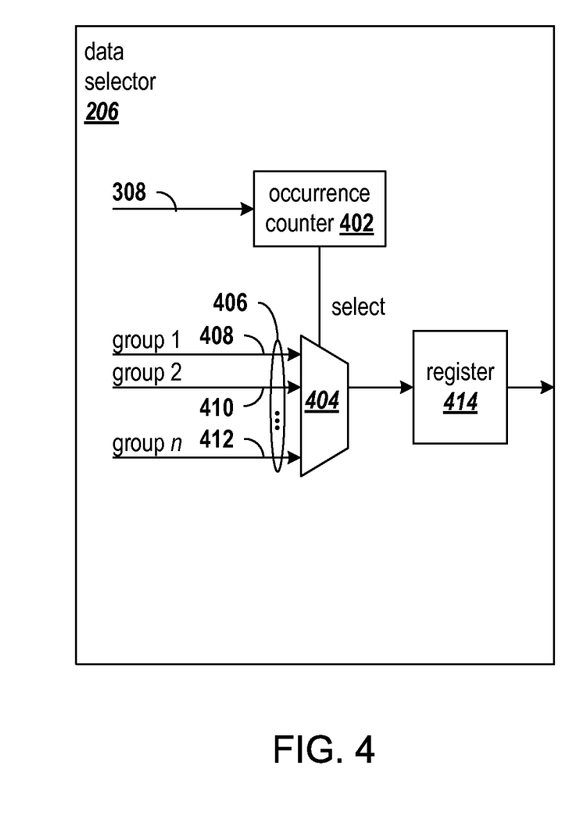
FIG. 4 is a block diagram of the data selector of FIG. 2.

FIG. 4 is a block diagram of the data selector 206 of FIG. 2. An occurrence counter 402 counts the assertions of the trigger signal on line 308 from the trigger-and-capture circuit 204. The occurrence counter 402 is initialized to zero when the user specifies a trigger condition or the circuit-under-test 202 is activated. The occurrence counter increments for each assertion of the trigger signal on line 308.

The occurrence value of the occurrence counter 402 is the select input for multiplexer 404. If the occurrence counter 402 has its initial value, then from the data signals on lines 406, multiplexer 404 selects the first subset group on line 408. After the trigger condition occurs and the trigger signal on line 308 is asserted, occurrence counter 402 increments and multiplexer 404 selects the next subset group on line 410. For each assertion of the trigger signal on line 308, the occurrence counter 402 increments and multiplexer 404 selects the next subset group until multiplexer 404 selects the last subset group on line 412. Register 414 stores the data selected by multiplexer 404 for transfer to the data compressor 208. The number of groups 408 and 410 through 412 depends on the number of monitored signals and the width of the datapath through register 414. The number of groups is one when the number of monitored signals is less than the width of the datapath.

Figure 5:
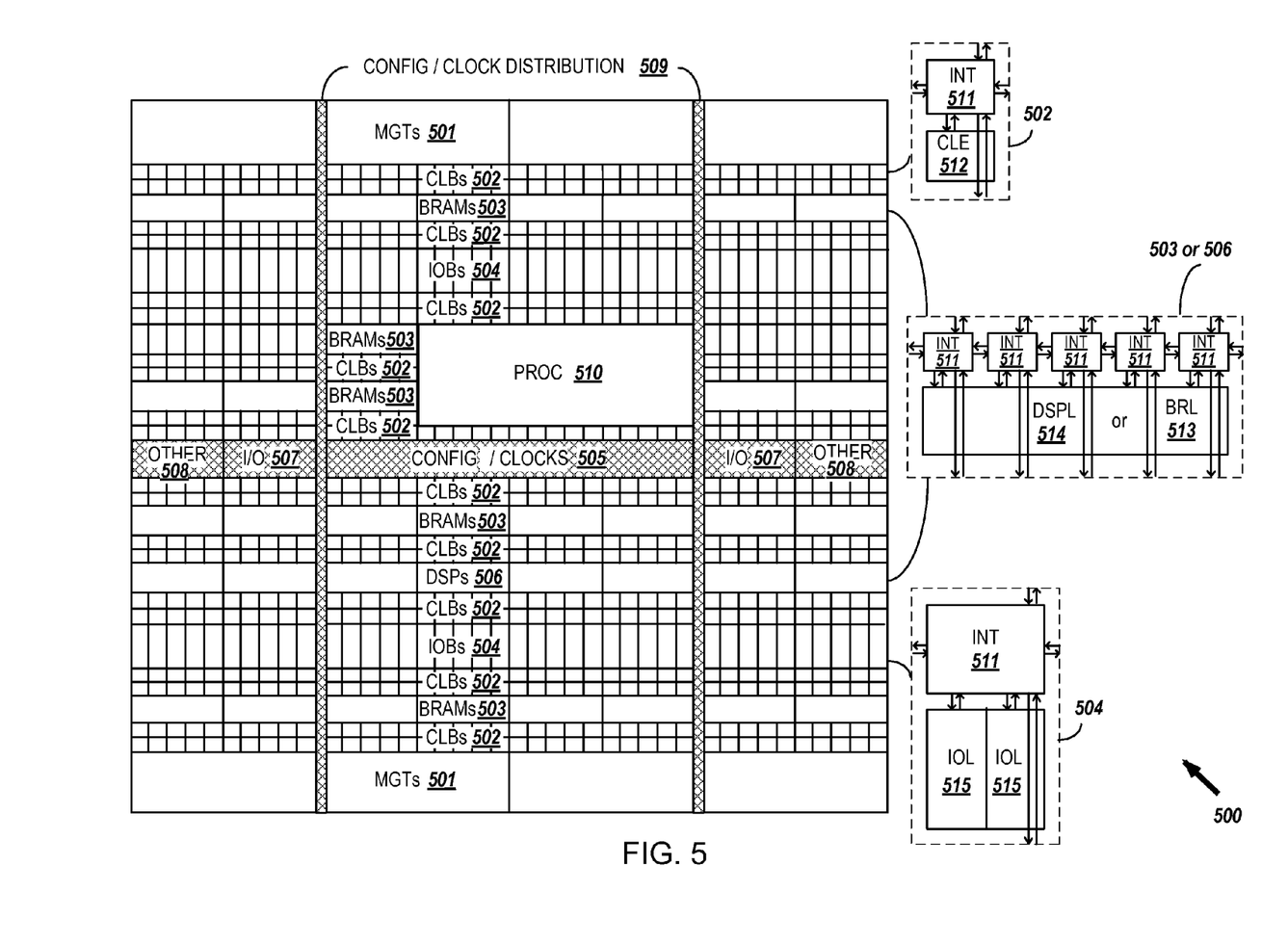
FIG. 5 is a block diagram of an example programmable integrated circuit (IC) die including programmable logic and interconnect resources that are configurable to implement a circuit-under-test and a debugging circuit for the circuit-under-test.

FIG. 5 is a block diagram of an example programmable integrated circuit (IC) die including programmable logic and interconnect resources that are configurable to implement a circuit-under-test and a debugging circuit for the circuit-under-test. The implemented debugging circuit stores the compressed states of designated signals of the circuit-under-test in a separate memory IC die.

One type of programmable IC die is a field-programmable gate array (FPGA) die. FPGAs can include several different types of programmable logic blocks in the array. For example, FIG. 5 illustrates an FPGA architecture (500) that includes a large number of different programmable resource tiles including multi-gigabit transceivers (MGTs 501), configurable logic blocks (CLBs 502), random access memory blocks (BRAMs 503), input/output blocks (IOBs 504), configuration and clocking logic (CONFIG/CLOCKS 505), digital signal processing blocks (DSPs 506), specialized input/output blocks (I/O 507), for example, clock ports, and other programmable logic 508 such as digital clock managers, analog to-digital converters, system monitoring logic, and so forth. Some FPGAs also include dedicated processor blocks (PROC 510).

In some FPGAs, each programmable tile includes a programmable interconnect element (INT 511) having standardized connections to and from a corresponding interconnect element in each adjacent tile. Therefore, the programmable interconnect elements taken together implement the programmable interconnect resources for the illustrated FPGA. The programmable interconnect element INT 511 also includes the connections to and from the programmable logic element within the same tile, as shown by the examples included at the top of FIG. 5.

For example, a CLB 502 can include a configurable logic element CLE 512 that can be programmed to implement user logic plus a single programmable interconnect element INT 511. A BRAM 503 can include a BRAM logic element (BRL 513) in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 506 can include a DSP logic element (DSPL 514) in addition to an appropriate number of programmable interconnect elements. An IOB 504 can include, for example, two instances of an input/output logic element (IOL 515) in addition to one instance of the programmable interconnect element INT 511. As will be clear to those of skill in the art, the actual I/O pads connected, for example, to the I/O logic element 515 are manufactured using metal layered above the various illustrated logic blocks, and typically are not confined to the area of the input/output logic element 515.

In the pictured embodiment, a columnar area near the center of the die (shown shaded in FIG. 5) is used for configuration, clock, and other control logic. Horizontal areas 509 extending from this column are used to distribute the clocks and configuration signals across the breadth of the FPGA.

Some FPGAs utilizing the architecture illustrated in FIG. 5 include additional logic blocks that disrupt the regular columnar structure making up a large part of the FPGA. The additional logic blocks can be programmable blocks and/or dedicated logic. For example, the processor block PROC 510 shown in FIG. 5 spans several columns of CLBs and BRAMs.

Note that FIG. 5 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 5 are purely exemplary. For example, in an actual FPGA more than one adjacent column of CLBs is typically included wherever the CLBs appear, to facilitate the efficient implementation of user logic.

It will be appreciated that PLDs having different layouts of CLBs, IOBs, and interconnect circuitry (and the functional equivalents thereof) may also implement the various embodiments of the invention described herein.

The embodiments are thought to be applicable to a variety of systems for gathering data for debugging a circuit-undertest. Other aspects and embodiments will be apparent to those skilled in the art from consideration of the specification. The embodiments may be implemented using one or more processors configured to execute software, using one or more application specific integrated circuit (ASIC) dies, or using programmable logic and interconnect resources on a programmable logic device. It is intended that the specification and illustrated embodiments be considered as examples only, with a true scope and spirit of the invention being indicated by the following claims.

What is claimed is:

1. A system for gathering data for debugging a circuit-under-test, comprising:
   a trigger-and-capture circuit coupled to the circuit-under-test for receiving a plurality of signals from the circuit-under-test, wherein the trigger-and-capture circuit is configured to assert a trigger signal in response to one or more of the plurality of signals matching a trigger condition;
   a data selector coupled to receive from the trigger-and-capture circuit the trigger signal and a plurality of subsets of the plurality of signals from the circuit under test, the data selector configured to increment an occurrence count value in response to assertion of the trigger signal, and further configured to select and output data of one of the plurality of subsets of signals in response to the value of the occurrence count;
   a data compressor coupled to the trigger-and-capture circuit and configured to loss-lessly compress the plurality of signals into compressed data;
   a direct memory access (DMA) controller coupled to the data compressor and configured to generate a plurality of write requests for writing the compressed data to a memory integrated circuit (IC) die and a plurality of read requests for reading the compressed data from the memory IC die; and
   a memory controller coupled to the DMA controller and configured to perform the pluralities of write and read requests.

2. The system of claim 1, wherein the DMA controller generates the plurality of read requests in response to assertion of the trigger signal.

3. The system of claim 2, wherein the DMA controller generates the plurality of read requests in response to assertion of the trigger signal and an information request from a user of the system.

4. The system of claim 1, wherein the DMA controller generates the plurality of read requests in response to an information request from a remote user of the system.

5. A system for gathering data for debugging a circuit-under-test, comprising:
   a trigger-and-capture circuit coupled to the circuit-under-test for receiving a plurality of signals from the circuit-under-test;
   wherein the trigger-and-capture circuit is configured to assert a trigger signal in response to one or more of the plurality of signals matching a trigger condition, and is further configured to increment an occurrence count at each assertion of the trigger signal;
   a data selector coupled to receive from the trigger-and-capture circuit a plurality of subsets of the plurality of signals from the circuit under test, and configured to select and output data of one of the plurality of subsets of signals in response to a value of the occurrence count;
   a data compressor coupled to the data selector and configured to loss-lessly compress the selected data for each occurrence value into compressed data for the occurrence value;
   a direct memory access (DMA) controller coupled to the data compressor and configured to generate a plurality of write requests for writing the compressed data for each occurrence value to a memory and a plurality of read requests for reading the compressed data for each occurrence value from the memory; and
   a memory controller coupled to the DMA controller and configured to perform the pluralities of write and read requests with the memory.

6. The system of claim 5, further comprising the circuit-under-test in a first integrated circuit (IC) die, wherein:
   a second IC die includes the memory; and
   the first IC die also includes the trigger-and-capture circuit, the data selector, the data compressor, the DMA controller, and the memory controller.

7. The system of claim 6, wherein:
   the first IC die includes a plurality of programmable logic and interconnect resources; and
   the plurality of programmable logic and interconnect resources is configured to implement the trigger-and-capture circuit, the data selector, the data compressor, the DMA controller, and the memory controller.

8. The system of claim 7, further comprising:
   an interface coupled to the trigger-and-capture circuit, wherein the trigger condition is written into the trigger-and-capture circuit via the interface;
   a write first-in-first-out (FIFO) buffer coupling the data compressor and the DMA controller, wherein the write FIFO buffer transfers the compressed data for each occurrence value from the data compressor to the DMA controller;
   a read FIFO buffer coupling the DMA controller and the interface, wherein the read FIFO buffer transfers the compressed data for each occurrence value from the DMA controller to the interface; and
   wherein the plurality of programmable logic and interconnect resources of the first IC die is configured to implement the interface, the write FIFO buffer, and the read FIFO buffer.

9. The system of claim 8, further comprising a general-purpose computer coupled to the interface, wherein:
   a user of the general-purpose computer specifies the trigger condition;
   in response to the user specifying the trigger condition, the general-purpose computer writes the trigger condition into the trigger-and-capture circuit via the interface;
   the general-purpose computer receives the compressed data for each occurrence value from the memory via the interface, the read FIFO buffer, the DMA controller, and the memory controller;
   the general-purpose computer decompresses the plurality of states of the plurality of signals from the compressed data for the plurality of occurrence values; and
   the general-purpose computer displays the plurality of states of the plurality of signals.

10. The system of claim 9, wherein:
    the user of the general-purpose computer specifies an address and a size of a data buffer within the memory;
    the DMA controller generates the plurality of write transactions that write the compressed data for each occurrence value into the data buffer;

the DMA controller generates the plurality of read transactions that read the compressed data for each occurrence value from the data buffer;

the general-purpose computer receives the compressed data for each occurrence value;

in response to each assertion of the trigger signal, the general-purpose computer decompresses the plurality of states of the respective subset of the plurality of signals for the occurrence value at the assertion of the trigger signal, the plurality of states being decompressed from the compressed data for the occurrence value at the assertion of the trigger signal; and in response to each assertion of the trigger signal, the general-purpose computer displays the plurality of states of the respective subset of the plurality of signals for the occurrence value at the assertion of the trigger signal, the plurality of states of the respective subset of the plurality of signals for the occurrence value being displayed in a cumulative display that includes the plurality of states of the respective subset for each occurrence value up to the occurrence count.

11. The system of claim 10, wherein:
the user of the general-purpose computer is a remote user that submits an information request; and
in response to the information request, the general-purpose computer decompresses and displays the plurality of states of the respective subset of the plurality of signals for the occurrence value currently provided by the occurrence count.

12. The system of claim 11, wherein the interface is one of a serial boundary-scan interface, an Ethernet interface, an interface for Universal Serial Bus (USB), and an interface for Peripheral Component Interconnect (PCI) Express.

13. A method for gathering data for debugging a circuit-under-test, comprising:
asserting a trigger signal in response to a plurality of signals of the circuit-under-test satisfying a trigger condition;
incrementing an occurrence count in response to each assertion of the trigger signal;
selecting a respective subset of the plurality of signals for each assertion of the trigger signal in response to a value of the occurrence count, the respective subset being selected according to the value of the occurrence count;
loss-lessly compressing a plurality of states of the respective subset for each assertion of the trigger signal, the plurality of states being loss-lessly compressed into compressed data for the assertion of the trigger signal;
generating and performing a plurality of write requests for storing the compressed data for each assertion of the trigger signal in a memory integrated circuit (IC) die;
generating and performing a plurality of read requests for reading the compressed data for each assertion of the trigger signal from the memory IC die;
decompressing the plurality of states of the respective subset for each assertion of the trigger signal; and
displaying the plurality of states of the respective subset for each assertion of the trigger signal.

14. The method of claim 13, further comprising:
implementing the circuit-under-test in a plurality of programmable logic and interconnect resources of a programmable IC die;
implementing a trigger-and-capture circuit, a data selector, a data compressor, a direct memory access (DMA) controller, and a memory controller in the plurality of programmable logic and interconnect resources of the programmable IC die; and wherein:
the asserting includes the asserting by the trigger-and-capture circuit;
the selecting includes the selecting by the data selector;
the loss-lessly compressing includes the loss-lessly compressing by the data compressor:
the generating of the plurality of write requests includes generating the plurality of write requests by the DMA controller:
the generating of the plurality of read requests includes generating the plurality of read requests by the DMA controller:
the performing of the plurality of write requests includes performing the plurality of write requests by the memory controller; and
the performing of the plurality of read requests includes performing the plurality of read requests by the memory controller.

15. The method of claim 14, further comprising:
specifying the plurality of signals of the circuit-under-test and the respective subset of the plurality of signals for each of a plurality of assertions of the trigger signal;
wherein the implementing of the trigger-and-capture circuit includes configuring the programmable logic and interconnect resources to transfer the plurality of signals from the circuit-under-test to the data selector; and
wherein the implementing of the data selector includes configuring the programmable logic and interconnect resources to select, from the plurality of signals, the respective subset for each of the plurality of assertions of the trigger signal.

16. The method of claim 15, further comprising:
specifying the trigger condition and an address and a size of a data buffer within the memory IC die;
wherein the generating of the plurality of write requests includes generating the plurality of write requests to the data buffer, and the generating of the plurality of read requests includes generating the plurality of read requests from the data buffer.

17. The method of claim 16, wherein the selecting of the respective subset of the plurality of signals for each of the plurality of assertions of the trigger signal includes incrementing an occurrence count at each of the plurality of assertions of the trigger signal, and selecting the respective subset in response to the occurrence count.

18. The method of claim 17, wherein:
the decompressing of the plurality of states of the respective subset for each assertion of the trigger signal includes decompressing the plurality of states from the compressed data for the occurrence value at each of the plurality of assertions of the trigger signal; and
the displaying of the plurality of states of the respective subset for each assertion of the trigger signal includes displaying the plurality of states for each of the plurality of assertions of the trigger signal in a cumulative display that includes the plurality of states of the respective subset for each occurrence value up to the occurrence count.

19. The method of claim 17, further comprising:
physically removing the memory IC die from a system including the memory IC die and the programmable IC die;
connecting the memory IC die to a computer system for a remote user;
receiving an information request from the remote user; and in response to the information request, decompressing and displaying the plurality of states of the respective subset of the plurality of signals for each occurrence value.

\* \* \* \* \*